(12) United States Patent
Lin

(10) Patent No.: US 11,251,211 B2
(45) Date of Patent: Feb. 15, 2022

(54) AMBIENT LIGHT SENSOR HAVING CONCENTRIC GEOMETRY

(71) Applicant: STMicroelectronics Ltd, Kowloon (HK)

(72) Inventor: Yu-Tsung Lin, Hsinchu (TW)

(73) Assignee: STMicroelectronics Ltd, Tsim Sha Tsui (HK)

( * ) Notice: Subject to any disclaimer, the term of this patent is extended or adjusted under 35 U.S.C. 154(b) by 251 days.

(21) Appl. No.: 16/721,253

(22) Filed: Dec. 19, 2019

(65) Prior Publication Data

US 2021/0193709 A1 Jun. 24, 2021

(51) Int. Cl.
*H01L 27/14* (2006.01)
*H01L 27/146* (2006.01)
*G01J 3/51* (2006.01)
*G01J 1/42* (2006.01)

(52) U.S. Cl.
CPC ...... *H01L 27/14607* (2013.01); *G01J 1/4204* (2013.01); *G01J 3/51* (2013.01); *H01L 27/14621* (2013.01); *H01L 27/14645* (2013.01)

(58) Field of Classification Search
CPC ......... H01L 27/14605; H01L 27/14607; H01L 27/14621; H01L 27/14645; G01J 1/4204; G01J 3/51

See application file for complete search history.

(56) References Cited

U.S. PATENT DOCUMENTS

| 2009/0015785 | A1* | 1/2009 | Blum ............... G02C 7/083 351/159.01 |
| 2013/0168552 | A1 | 7/2013 | Tsang et al. |
| 2014/0312234 | A1 | 10/2014 | Tan |
| 2016/0232828 | A1 | 8/2016 | Jia et al. |
| 2017/0116962 | A1 | 4/2017 | Goodman |
| 2019/0017867 | A1 | 1/2019 | Lai et al. |
| 2019/0080668 | A1 | 3/2019 | Holenarsipur et al. |
| 2019/0285467 | A1* | 9/2019 | Chen ............... G01J 1/4204 |

OTHER PUBLICATIONS

TI Designs: "Backlight and Smart Lighting Control by Ambient Light and Proximity Sensor," TIDU781, Mar. 2015, 34 pages.
AM5 Datasheet, DS000504, "AS7341, 11-Channel Spectral Sensor Frontend," v1-00, Oct. 17, 2018, 67 pages.

\* cited by examiner

*Primary Examiner* — Kevin K Pyo
(74) *Attorney, Agent, or Firm* — Crowe & Dunlevy

(57) ABSTRACT

Disclosed herein is an ambient light sensor formed by a substrate, and an inner central area defined on the substrate, and a concentric polygonal shape defined on the substrate about the inner central area. The concentric polygonal shape is defined by concentric polygonal isolation regions and spoke shaped isolation regions extending through respective corners of the concentric polygonal isolation regions to the inner central area to thereby divide the concentric polygonal shape into a plurality of concentric polygonal regions, with each of the plurality of concentric polygonal regions divided into a plurality of trapezoidal sections. A plurality of photodiodes ae formed on the substrate such that each of the plurality of trapezoidal sections contains at least one photodiode. A color filter is applied to the plurality of trapezoidal sections and their respective photodiodes to thereby form a plurality of color channels.

22 Claims, 7 Drawing Sheets

AMBIENT LIGHT SENSOR HAVING CONCENTRIC GEOMETRY

TECHNICAL FIELD

This application is directed to the field of electronic imaging devices, and in particular, to an ambient light sensor formed from multiple photodiodes and an associated color filter arranged into a concentric pattern.

BACKGROUND

Ambient light sensors may be incorporated into electronic devices, such as smartphones, to enable those devices to sense ambient lighting conditions and determine data such as the intensity and color temperature of those ambient lighting conditions. This data may, in turn, be used by the electronic device to adjust the color profile of images displayed on a display panel so that said images, when viewed by a human eye under the sensed ambient lighting conditions, appear as intended. Without the use of such an ambient light sensor, images displayed on the display panel could look unpleasant or unnatural to the human eye.

In order for an ambient light sensor to sense both intensity and color temperature of ambient lighting conditions, the ambient light sensor is formed from multiple photodiodes and an associated color filter that applies different filtering conditions to different photodiodes. A sample design for such an ambient light sensor 50 is shown in FIG. 1.

Here, the ambient light sensor 50 is circular in shape, with a concentric inner central area 51, and has a "pie slice" patterned color filter arranged about the inner central area 51. The color filter is formed by four separate color channels arranged into a specific pattern, with each color channel being repeated four times. Therefore, the color filter is comprised of sixteen slices 51 (with a respective photodiode being under each slice 51), with four slices 51a for the first color, four slices 51b for the second color, four slices 51c for the third color, and four slices 51d for the fourth color.

A variation of this color filter design is shown in the ambient light sensor 60 of FIG. 2, with different shadings representing the different color channels. Here, it can be seen that the color filter applied to the ambient light sensor 60 is comprised of twelve color channels repeated four times each. Therefore, the color filter is comprised of forty eight slices 61, with four slices 61a, four slices 61b, four slices 61c, four slices 61d, four slices 61e, four slices 61f, four slices 61g, four slices 61h, four slices 61i, four slices 61j, four slices 61k, and four slices 61l.

A potential issue with the general designs of FIGS. 1-2 is with forming such devices. Depending on the color filter to be applied to an ambient light sensor, there is a minimum width that the small end of each slice must be in order to be able to be properly formed using known integrated circuit fabrication processes. For example, where a multi-film type color filter is to be used, the small end of each slice should be at least 5 μm in width, or as shown in FIG. 2A, the delineation between different adjacent slices becomes jagged, leading to poor performance. Where a resin type color filter is to be used, the small end of each slice can be as small as 1 μm in width before the delineation between different adjacent slices becomes jagged enough to lead to poor performance.

Therefore, the limitations of the designs of FIGS. 1-2 are apparent—due to the minimum small end slice widths imposed, a given color filter of these designs may include only a limited number of color channels with a limited number of repetitions per color channel. As such, to allow for the formation of ambient light sensors that exceed said limited numbers of color channels and/or said limited number of repetitions per color channel, further development is needed.

SUMMARY

Disclosed herein is an ambient light sensor including: a substrate; an inner central area defined on the substrate; a concentric shape defined on the substrate about the inner central area by concentric isolation regions to and spoke shaped isolation regions extending through respective portions of the concentric isolation regions to the inner central area to thereby divide the concentric shape into a plurality of concentric regions, with each of the plurality of concentric regions into a plurality of sections; a plurality of photodiodes formed on the substrate such that each of the plurality of sections contains at least one photodiode; and a color filter applied to the plurality of sections and their respective photodiodes to thereby form a plurality of color channels, with at least some of the plurality of color channels being associated with respective ones of the plurality of sections so as to occupy a greater total photodiode area than others of the plurality of color channels.

The at least one photodiode within each of the plurality of sections may have a total photodiode area commensurate with an inner area of that section delineated by the isolation regions forming that section.

The at least one photodiode within at least some of the plurality of sections may include a plurality of photodiodes.

The at least one photodiode within each of the plurality of sections may be a singular photodiode occupying substantially all of an inner area of that section delineated by the isolation regions forming that section.

The at least one photodiode within each of the plurality of sections may respond differently to different wavelengths of light. In addition, the color filter may include the plurality of color channels, with at least some of the plurality of color channels being associated with at least three of the plurality of sections, the at least one photodiodes of the at least three of the plurality of sections having poorer response to at least some wavelengths of light outside of a range of human photopic vision than to wavelengths of light inside of the range of human photopic vision.

The at least one photodiode within each of the plurality of sections may respond differently to different wavelengths of light such that the at least one photodiode within each of the plurality of sections has poorer response to at least some wavelengths of light outside of a range of human photopic vision than to wavelengths of light inside of the range of human photopic vision. In addition, the color channels assigned to the at least some wavelengths of light outside of the range of human photopic vision are associated with the sections within an outer one of the plurality of concentric regions.

The color filter may include the plurality of color channels, with at least some of the plurality of color channels being associated with at least three of the plurality of sections.

The color filter may include the plurality of color channels, with at least some of the plurality of color channels being associated with at least three of the plurality of sections but with others of the plurality of color channels being associated with at least two of the plurality of sections.

Another aspect disclosed herein is a color filter formed from, at least, a plurality of concentric segmented loops each different in radii or diameter from one another, with passband photonic filters respectively forming each segment of the plurality of segmented loops. At least some of the passband photonic filters may be identical to one another, and at least some of the passband photonic filters may be different from one another.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
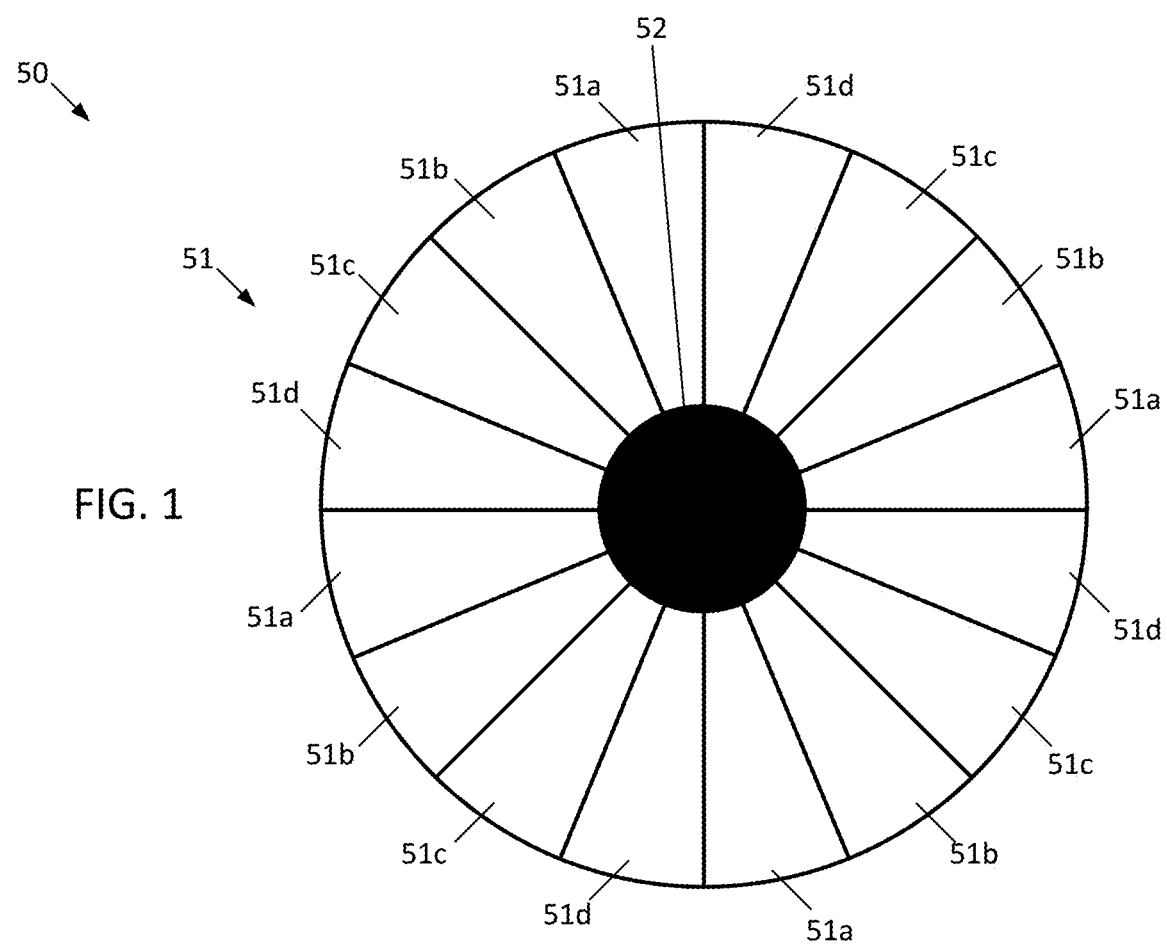
FIG. 1 is a top plan view of a first prior art ambient light sensor described above.
Figure 2:
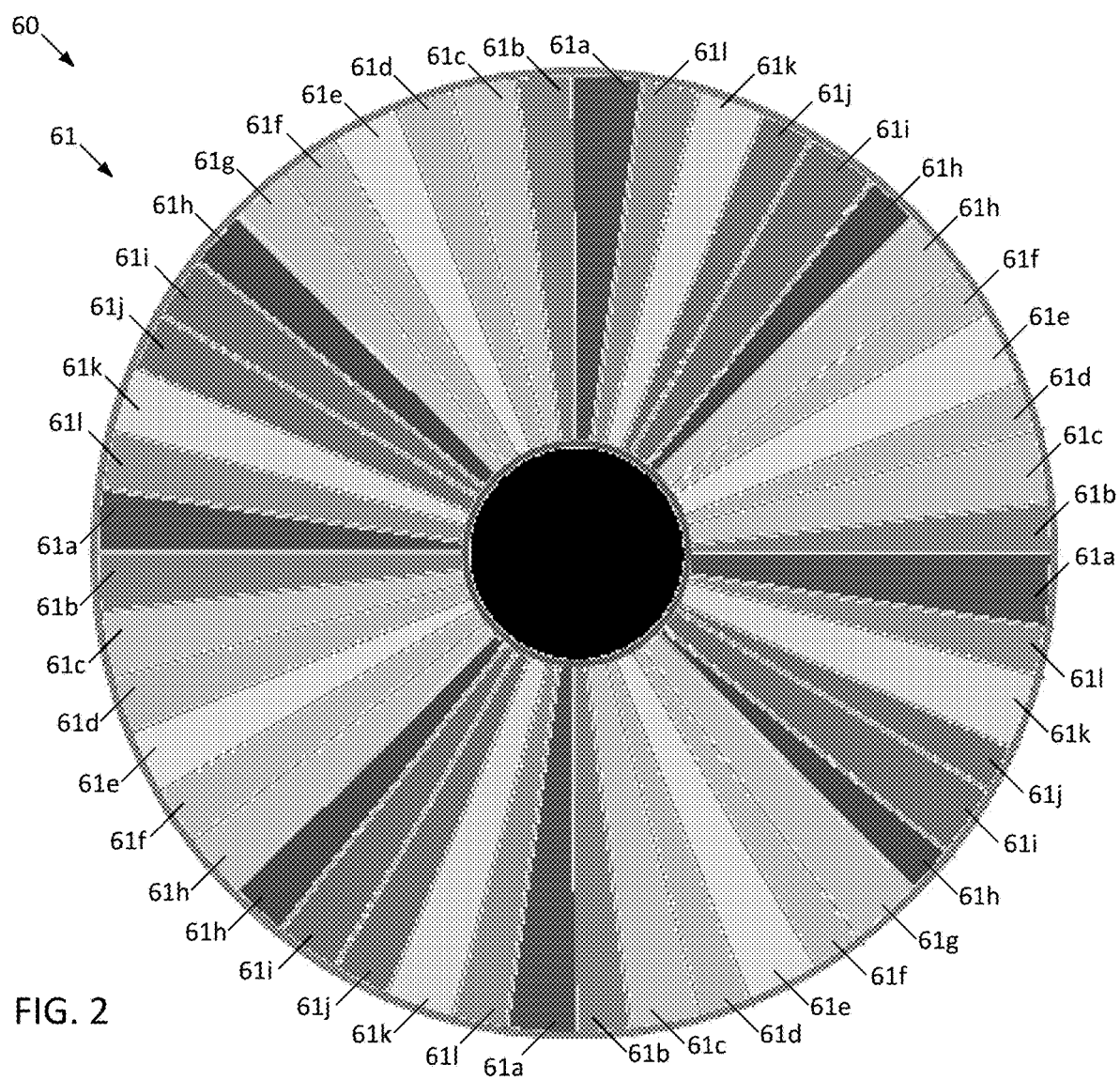
FIG. 2 is a top plan view of a second prior art ambient light sensor described above.
Figure 2A:
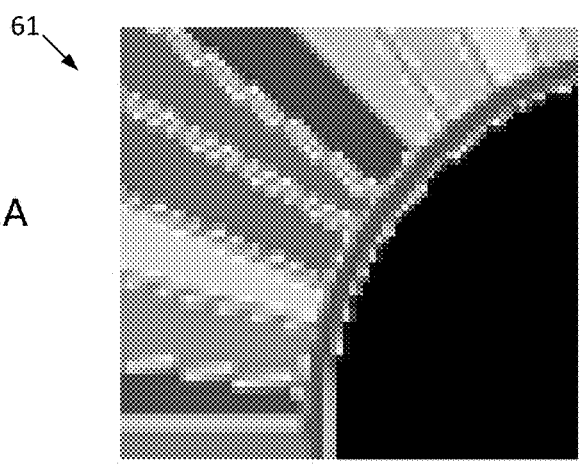
FIG. 2A is a greatly enlarged top plan view of a portion of the prior art ambient light sensor of FIG. 2, described above.
Figure 3:
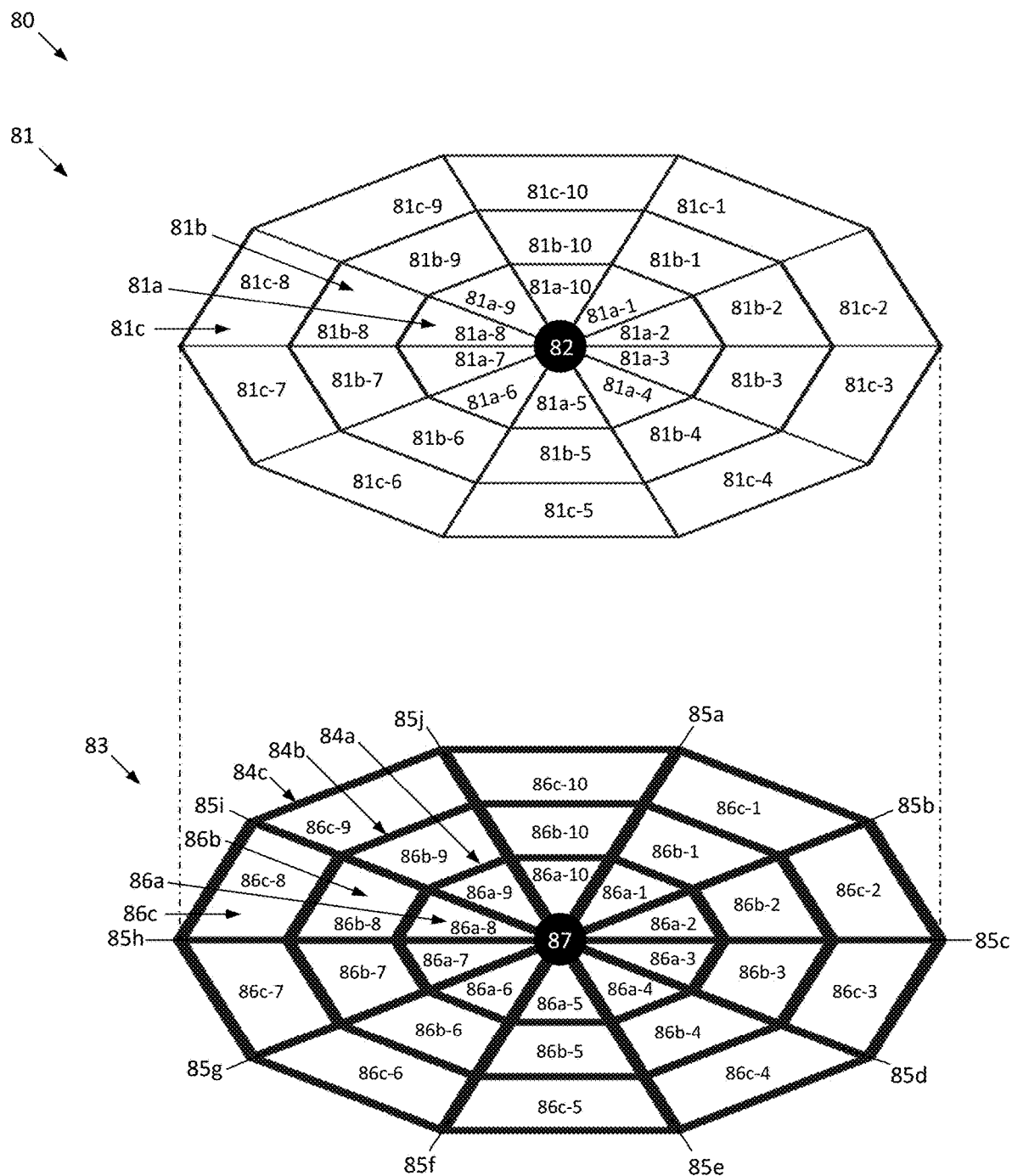
FIG. 3 is an exploded view of a sample embodiment of an ambient light sensor disclosed herein.

Now described with reference to FIG. 3 is an ambient light sensor 80 comprised of a substrate layer 83 with a color filter layer 81 formed on the substrate layer 83.

The substrate layer 83 is comprised of a silicon substrate having concentric rings 86a-86c of different radii formed therein about an inner central area 87. The concentric rings 86a-86c are 10-sided polygonal rings. The concentric rings 86a-86c are formed by isolation regions 84a-84c, with isolation region 84c forming the outer edge of the ring 86c, isolation region 84b forming the inner edge of the ring 86c and outer edge of the ring 86b, isolation region 84a forming the inner edge of the ring 86b and the outer edge of the ring 86a, and the inner central area 87 forming the inner edge of the ring 86a. Isolation regions 85a-85j divide the concentric rings 86a-86c into respective sections: the ring 86a is divided into sections 86a-1 to 86a-10; the ring 86b is divided into sections 86b-1 to 86b-10; and the ring 86c is divided into sections 86c-1 to 86c-10. This therefore results in the concentric rings 86a-86c being defined as closed segmented loops. At least one photodiode is formed within the silicon substrate of each section. Optionally, the photosensitive area within the substrate of each section may commensurate in size with the size of that section.

Note that although the isolation regions 84a-84c and 85a-85j are shown as forming 10-sided polygonal rings 86a-86c, the isolation regions may take any suitable shapes (3 sides or greater polygonal shapes, ellipsoid shaped, circular shapes, etc) provided that at least two concentric rings are formed, with each concentric ring being divided into at least two sections.

The color filter layer 81 is formed so as to contain concentric filter rings 81a-81c having the same dimensions as the concentric rings 86a-86c of the substrate layer 83 so that the color filter layer 81 applies its filters to the concentric rings 86a-86c on a section by section basis. Therefore: the concentric filter ring 81a is comprised of sections 81a-1 to 81a-10; the concentric filter ring 81b is comprised of sections 81b-1 to 81b-10; and the concentric filter ring 81c is comprised of sections 81c-1 to 81c-10. The sections 81a-1 to 81a-10 overlie the sections 86a-1 to 86a-10, the sections 81b-1 to 81b-10 overlie the sections 86b-1 to 86b-10, and the sections 81c-1 to 86c-10 overlie the sections 86c-1 to 86c-10 in direct correspondence, such that the section 81a-1 only covers the section 86a-1, the section 81b-1 only covers the section 86b-1, and the section 81c-1 only covers the section 86c-1. The color filter layer 81 in combination with the substrate layer 83 therefore forms a color channel for each segment.

Figure 4:
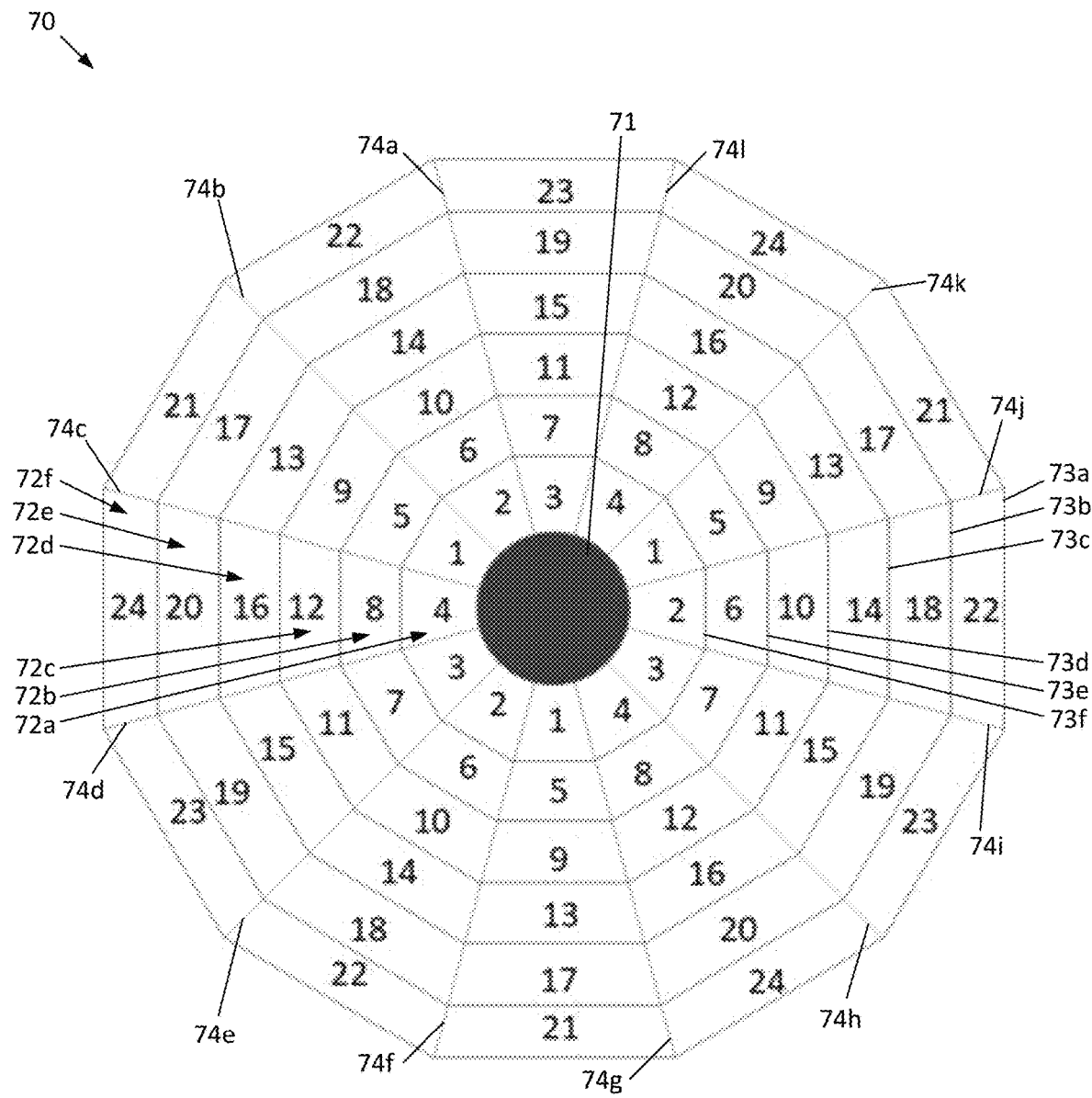
FIG. 4 is a top plan view of a sample color filter for an ambient light sensor disclosed herein.

Greater details of color filter layers such as may be used with these designs, and possibilities for forming such a color filter layer, as well as greater details of ambient light sensors that may be formed using the color filter layer, are now described with reference to FIG. 4. The ambient light sensor 70 of FIG. 4 is comprised of multiple concentric geometric shapes. In particular, the ambient light sensor is comprised of a substrate into or onto which six concentric twelve-sided polygons 72a-72f are arranged about an inner central area 71. The perimeters of the twelve-sided polygonal shapes 72a-72f are formed by respective isolation regions 73a-73f. Isolation regions 74a-74l extend through respective corners of the concentric twelve-sided polygonal shapes 72a-72f as spokes to reach the inner central area 71, thereby dividing each twelve-sides polygonal shape 72a-72f into twelve trapezoidal sections, with each trapezoidal section or containing one or more photodiodes formed onto or into the substrate, and having a portion of a color filter applied thereto to form a color channel.

In the example of FIG. 4, the ambient light sensor 70 is therefore divided into seventy-two trapezoidal sections, with twelve such trapezoidal sections per twelve-sided polygon 72a-72f. In addition, in the example of FIG. 4, the ambient light sensor 70 contains twenty-four color channels, with each color channel being repeated three times. These color channels are represented by the numbers 1-24 assigned to different trapezoidal sections of the twelve-sided polygons 72a-72f. Therefore, notice that: the twelve-sided polygon 72a contains three instances of each of the color channels 1-4; the twelve-sided polygon 72b contains three instances of each of the color channels 5-8; the twelve-sided polygon 72c contains three instances of each of the color channels 9-12; the twelve-sided polygon 72d contains three instances of each of the color channels 13-16; the twelve-sided polygon 72e contains three instances of each of the color channels 17-29; and the twelve-sided polygon 72f contains three instances of each of the color channels 21-24.

Note that where each trapezoidal section contains a single photodiode, that single photodiode may be formed so as to occupy substantially all of the inner area delineated by the isolation regions forming that trapezoidal section.

Alternatively, each photodiode within the ambient light sensor may have substantially the same dimensions, with different ones of the twelve-sided polygons 72a-72f containing different numbers of photodiodes within their trapezoidal sections than one another. Therefore, as an example: the trapezoidal sections of the twelve-sided polygon 72a may each contain a first number of substantially identical photodiodes; the trapezoidal sections of the twelve-sided polygon 72b may each contain a second number of substantially identical photodiodes; the trapezoidal sections of the twelve-sided polygon 72c may each contain a third number of substantially identical photodiodes; the trapezoidal sections of the twelve-sided polygon 72d may each contain a fourth number of substantially identical photodiodes; the trapezoidal sections of the twelve-sided polygon 72e may each contain a fifth number of substantially identical photodiodes; and the trapezoidal sections of the twelve-sided polygon 72f may each contain a sixth number of substantially identical photodiodes. The sixth number may be greater than the fifth number; the fifth number may be greater than the fourth number; the fourth number may be greater than the third number; the third number may be greater than the second number; and the second number may be greater than the first number.

Stated yet another way, each trapezoidal section may contain a total amount of photosensitive area (accomplished either through the number of photodiodes or through a single suitably sized photodiode) commensurate with the area of that trapezoidal section compared to other trapezoidal sections. Therefore: the trapezoidal sections of the twelve-sided polygon 72f may contain a greater amount of photodiode area than the trapezoidal sections of the twelve-sided polygon 72e; the trapezoidal sections of the twelve-sided polygon 72e may contain a greater amount of photodiode area than the trapezoidal sections of the twelve-sided polygon 72d; the trapezoidal sections of the twelve-sided polygon 72d may contain a greater amount of photodiode area than the trapezoidal sections of the twelve-sided polygon 72c; the trapezoidal sections of the twelve-sided polygon 72c may contain a greater amount of photodiode area than the trapezoidal sections of the twelve-sided polygon 72b; and the trapezoidal sections of the twelve-sided polygon 72b may contain a greater amount of photodiode area than the trapezoidal sections of the twelve-sided polygon 72a.

As an alternative, the trapezoidal sections of the twelve-sided polygons 72a-72b may each contain a first number of substantially identical photodiodes, while the trapezoidal sections of the twelve-sided polygons 72c-72d may each contain a second number of substantially identical photodiodes, and the trapezoidal sections of the twelve-sided polygons 72e-72f may each contain a third number of substantially identical photodiodes, with the third number being greater than the second number and the second number being greater than the first number.

As yet another alternative, the trapezoidal sections of the twelve-sided polygons 72a-72c may each contain a first number of substantially identical photodiodes, while the trapezoidal sections of the twelve-sided polygons 72d-72f may each contain a second number of substantially identical photodiodes, with the second number being greater than the first number.

It should be understood that other arrangements may be possible, possibly with the trapezoidal sections of each twelve-sided polygon 72a-72e containing no more photodiodes than the trapezoidal sections of each twelve-sided polygon 72b-72f external thereto in the concentric pattern. As an example: the trapezoidal sections of the twelve-sided polygon 72a may contain no more photodiodes than the trapezoidal sections of the twelve-sided polygon 72b; the trapezoidal sections of the twelve-sided polygon 72b may contain no more photodiodes than the trapezoidal sections of the twelve-sided polygon 72c; the trapezoidal sections of the twelve-sided polygon 72c may contain no more photodiodes than the trapezoidal sections of the twelve-sided polygon 72d; the trapezoidal sections of the twelve-sided polygon 72d may contain no more photodiodes than the trapezoidal sections of the twelve-sided polygon 72e; and the trapezoidal sections of the twelve-sided polygon 72e may contain no more photodiodes than the trapezoidal sections of the twelve-sided polygon 72f.

Figure 5:
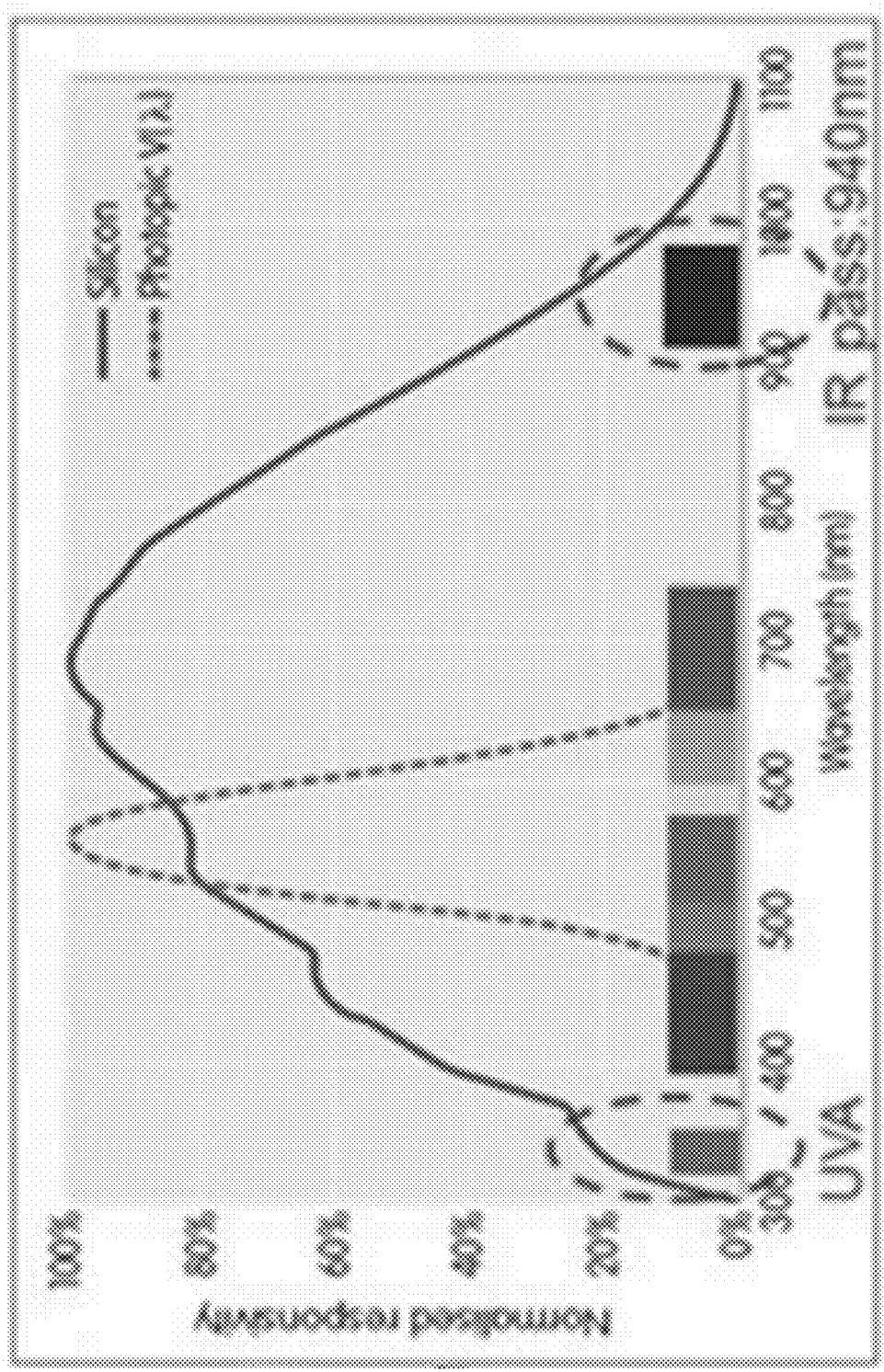
FIG. 5 is a graph showing the response of typical silicon photodiodes and photopic human vision to different wavelengths of light.

Shown in FIG. 5 is the response of silicon photodiodes and photopic human vision to different wavelengths of light. Note that the silicon photodiodes have generally good response (above 60%) to wavelengths of light within the range of photopic human vision, but have poor response (below 40%) to certain wavelengths of light substantially outside the range of photopic human vision, such as in the ultraviolet-a (UVA) and infrared (IR) ranges. Therefore, if it is desired to use the ambient light sensors described herein to detect these wavelengths of light outside of the range of photopic human vision to which silicon photodiodes have poor response, and if it is desired to substantially or somewhat normalize the response to those wavelengths of light outside of the range of photopic human vision to which silicon photodiodes have poor response with the response to wavelengths of light within the range of photopic human vision, it is evident that the color filter used for the ambient light sensor 70 may allocate a greater total amount of photodiode area to sensing those wavelengths of light outside of the range of photopic human vision to which silicon photodiodes have poor response than allocated to the wavelengths of light within the range of photopic human vision.

One way to achieve this is to locate the color channels dedicated to sensing those wavelengths of light outside of the range of photopic human vision to which silicon photodiodes have poor response within those trapezoidal sections having a greater amount of photodiode area, while maintaining the same number of repetitions for each color channel. Such an arrangement is shown with the ambient light sensor 70' of FIG. 6, which similar to that of FIG. 4. Here, each trapezoidal section contains a total amount of photodiode area (accomplished either through the number of photodiodes or through a single suitably sized photodiode) commensurate with the area of that trapezoidal section. Therefore, while each color channel is repeated three times (has three trapezoidal areas allocated to it), the color channels 22 and 24, respectively dedicated to the infrared and ultraviolet-a ranges of light, are located in the twelve-sided polygon 72f so as to provide additional photodiode area for those wavelength ranges light in an attempt to normalize the response of the ambient light sensor 70'.

Another way to allocate a greater total amount of photodiode area to sensing those wavelengths of light outside of the range of photopic human vision to which silicon photodiodes have poor response than allocated to the wavelengths of light within the range of photopic human vision is to repeat color channels dedicated to those wavelengths of light outside of the range of photopic human vision to which silicon photodiodes have poor response more times than color channels dedicated to those wavelengths of light within the range of photopic human vision. An arrangement accomplishing this is shown with the ambient light sensor 70" of FIG. 7, which is similar to that of FIG. 4. Here, regardless of whether each trapezoidal section contains a total amount of photodiode area commensurate with the area of that trapezoidal section, the color channels 24 and 18 are both dedicated to the ultraviolet-a range of light, meaning that there will be a total of six trapezoidal sections dedicated to sensing the ultraviolet-a range of light, but there will be three trapezoidal sections dedicated to sensing other wavelengths of light. Since the ambient light sensor 70" contains the same number of trapezoidal sections as the ambient light sensors 70 and 70', it should be apparent that the color filter used for the ambient light sensor 70" is different than the color filter used for the ambient light sensor 70'.

Figure 6:
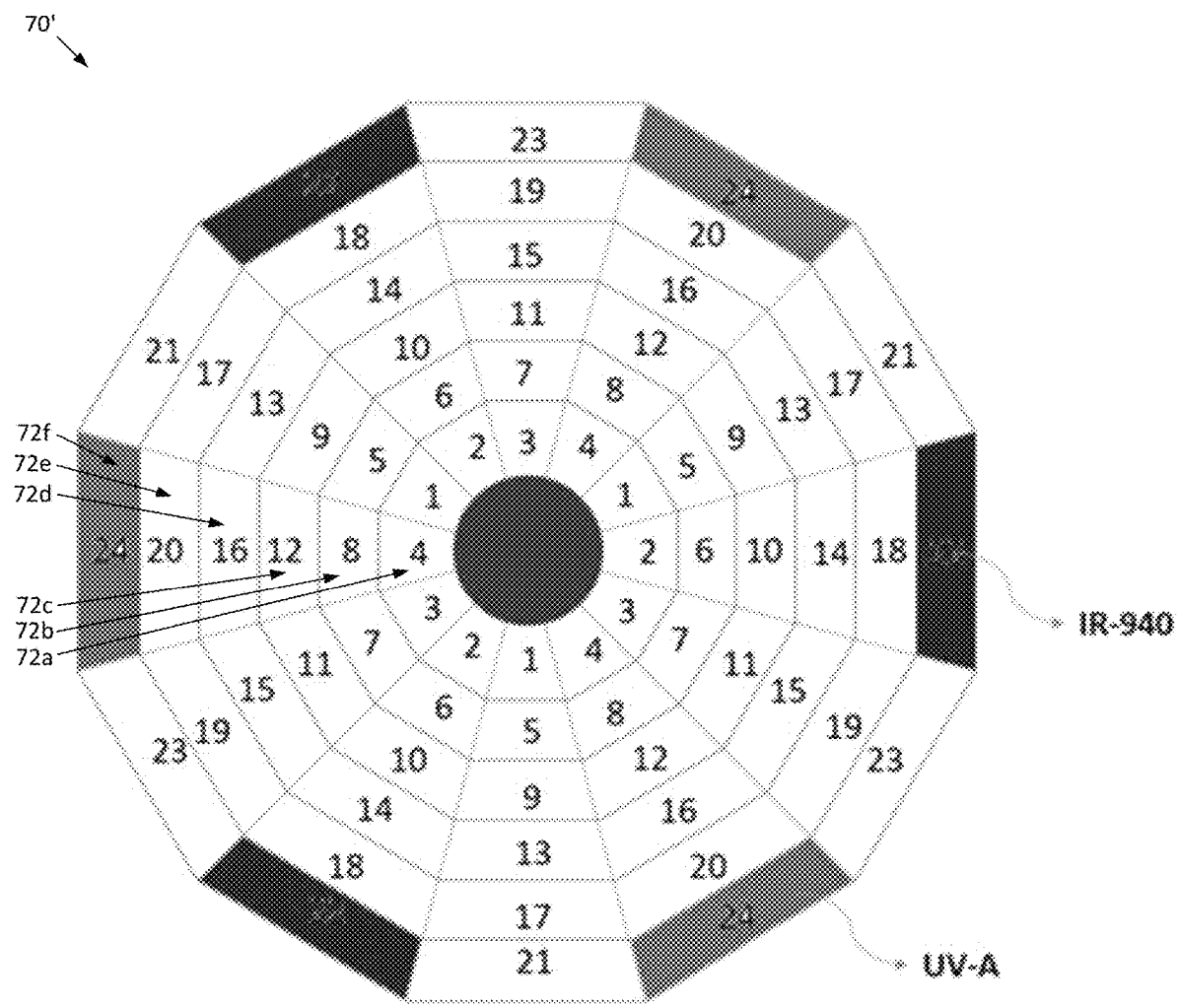
FIG. 6 is a top plan view of the embodiment of FIG. 4, but using the same shading scheme of FIG. 5 to show how the position of color channels in the ambient light sensor may be selected based upon the response of silicon photodiodes.
Figure 7:
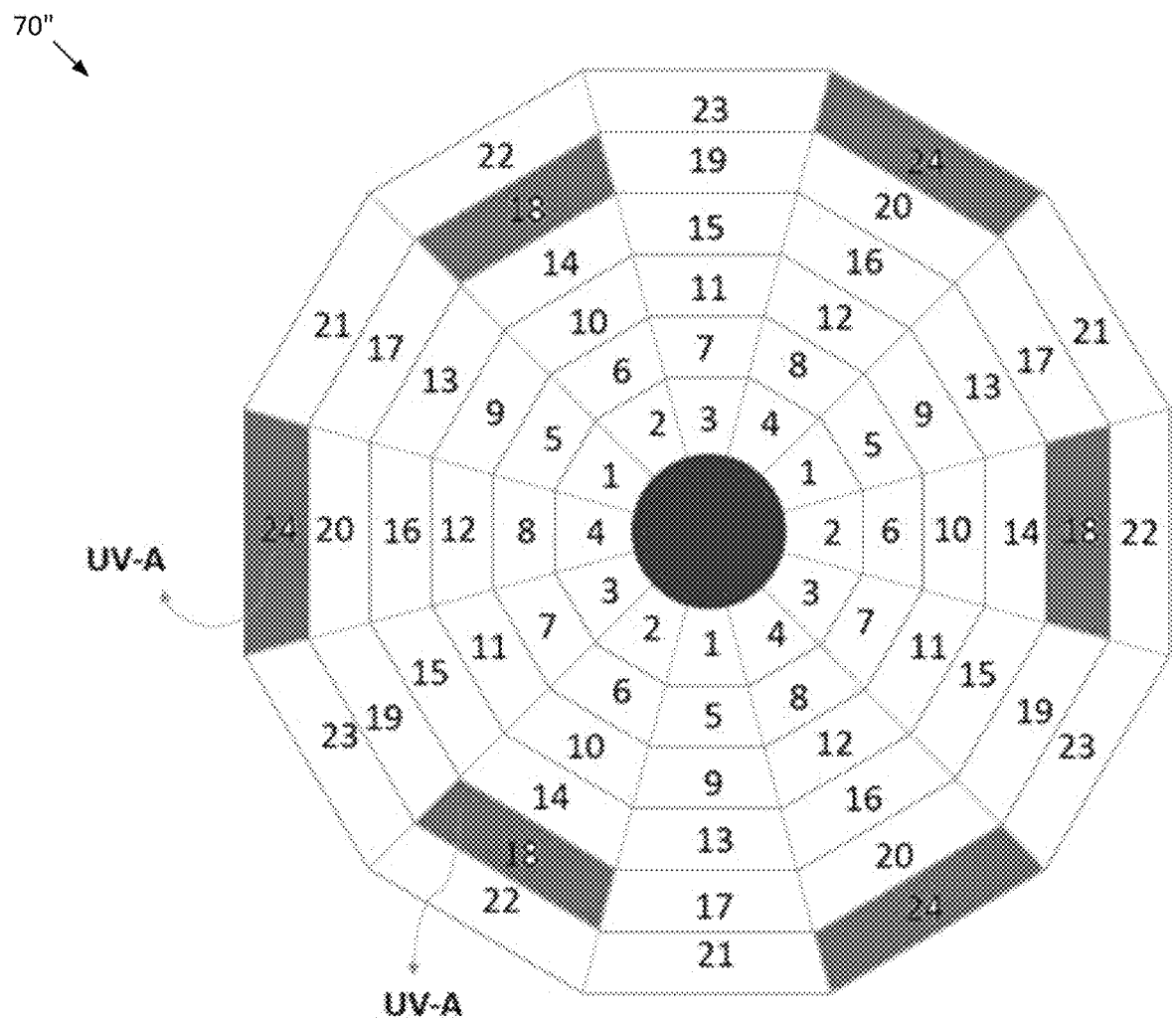
FIG. 7 is another top plan view of the embodiment of FIG. 4, but using the same shading scheme of FIG. 5 to further show how the position of the color channels may be based upon the response of silicon photodiodes.

It should be understood that the twelve-sided concentric polygonal structure shown in FIGS. 4, 6, and 7 is but one choice. Indeed, the concentric structure may be of any number of sides at least equal to three, and may contain any number of concentric rings. For example, the concentric structure may be a six-sided concentric polygonal structure comprised of twelve concentric layers. It should also be understood that the concentric structure need not be polygonal in shape, and indeed, may be circular or ellipsoidal in shape, with any number of concentric layers.

Note that regardless of which color filter is used, the pattern formed by that color pattern on the ambient light sensor is to have the center of mass of each color channel be located at the center of the inner central area. Therefore, the color filter is to dedicate at least two sections to each color channel, and these sections are to be equally spaced from one another. Those of skill in the art will appreciate that the total number of sections in a given light sensor formed using the above techniques therefore affects which color filters may be applied and how many times each color channel may be repeated. Any suitable color filter is within the scope of this disclosure, and indeed, with the designs possible with this disclosure, the color filter designer can now choose color and placement location for the color on the ambient light sensor to achieve desired certain reception or passband capabilities.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An ambient light sensor, comprising:
a substrate;
an inner central area defined on the substrate;
a concentric polygonal shape defined on the substrate about the inner central area by concentric polygonal isolation regions and spoke shaped isolation regions extending through respective corners of the concentric polygonal isolation regions to the inner central area to thereby divide the concentric polygonal shape into a plurality of concentric polygonal regions, with each of the plurality of concentric polygonal regions divided into a plurality of trapezoidal sections;
a plurality of photodiodes formed on the substrate such that each of the plurality of trapezoidal sections contains at least one photodiode; and
a color filter applied to the plurality of trapezoidal sections and their respective photodiodes to thereby form a plurality of color channels.

2. The ambient light sensor of claim 1, wherein the at least one photodiode within each of the plurality of trapezoidal sections is a singular photodiode occupying substantially all of an inner area of that trapezoidal section delineated by the isolation regions forming that trapezoidal section.

3. The ambient light sensor of claim 1, wherein the at least one photodiode within each of the plurality of trapezoidal sections has a total photodiode area commensurate with an inner area of that trapezoidal section delineated by the isolation regions forming that trapezoidal section.

4. The ambient light sensor of claim 3, wherein the at least one photodiode within at least some of the plurality of trapezoidal sections comprises a plurality of photodiodes.

5. The ambient light sensor of claim 3, wherein the at least one photodiode within each of the plurality of trapezoidal sections is a singular photodiode occupying substantially all of an inner area of that trapezoidal section delineated by the isolation regions forming that trapezoidal section.

6. The ambient light sensor of claim 3, wherein the at least one photodiode within each of the plurality of trapezoidal sections responds differently to different wavelengths of light such that the at least one photodiode within each of the plurality of trapezoidal sections has poorer response to at least some wavelengths of light outside of a range of human photopic vision than to wavelengths of light inside of the range of human photopic vision; and wherein the color channels assigned to the at least some wavelengths of light outside of the range of human photopic vision are associated with the trapezoidal sections within an outer one of the plurality of concentric polygonal regions.

7. The ambient light sensor of claim 6, wherein the at least some wavelengths of light outside the range of human phototopic vision include ultraviolet light.

8. The ambient light sensor of claim 6, wherein the at least some wavelengths of light outside the range of human phototopic vision include infrared light.

9. The ambient light sensor of claim 1, wherein the at least one photodiode within each of the plurality of trapezoidal sections responds differently to different wavelengths of light; and wherein the color filter is comprised of the plurality of color channels, with at least some of the plurality of color channels being associated with at least three of the plurality of trapezoidal sections, the at least one photodiodes of the at least three of the plurality of trapezoidal sections having poorer response to at least some wavelengths of light outside of a range of human photopic vision than to wavelengths of light inside of the range of human photopic vision.

10. The ambient light sensor of claim 1, wherein the at least one photodiode within each of the plurality of trapezoidal sections responds differently to different wavelengths of light such that the at least one photodiode within each of the plurality of trapezoidal sections has poorer response to at least some wavelengths of light outside of a range of human photopic vision than to wavelengths of light inside of the range of human photopic vision; and wherein the color channels assigned to the at least some wavelengths of light outside of the range of human photopic vision are associated with the trapezoidal sections within an outer one of the plurality of concentric polygonal regions.

11. The ambient light sensor of claim 1, wherein the color filter is comprised of the plurality of color channels, with at least some of the plurality of color channels being associated with at least three of the plurality of trapezoidal sections.

12. The ambient light sensor of claim 1, wherein the color filter is comprised of the plurality of color channels, with at least some of the plurality of color channels being associated with at least three of the plurality of trapezoidal sections but with others of the plurality of color channels being associated with at least two of the plurality of trapezoidal sections.

13. The ambient light sensor of claim 1, wherein the color filter is comprised of the plurality of color channels, with each of the plurality of color channels being associated with at least two of the plurality of trapezoidal sections; and wherein a center of mass of the at least two of the plurality of trapezoidal sections is at a center of the inner central area.

14. The ambient light sensor of claim 1, wherein the at least one photodiode within each of the plurality of trapezoidal sections comprises a silicon photodiode.

15. An ambient light sensor, comprising:
a substrate;
an inner central area defined on the substrate;
a concentric shape defined on the substrate about the inner central area by concentric isolation regions to and spoke shaped isolation regions extending through respective portions of the concentric isolation regions to the inner central area to thereby divide the concentric shape into a plurality of concentric regions, with each of the plurality of concentric regions into a plurality of sections;
a plurality of photodiodes formed on the substrate such that each of the plurality of sections contains at least one photodiode; and
a color filter applied to the plurality of sections and their respective photodiodes to thereby form a plurality of color channels, with at least some of the plurality of color channels being associated with respective ones of the plurality of sections so as to occupy a greater total photodiode area than others of the plurality of color channels.

16. The ambient light sensor of claim 15, wherein the at least one photodiode within each of the plurality of sections has a total photodiode area commensurate with an inner area of that section delineated by the isolation regions forming that section.

17. The ambient light sensor of claim 16, wherein the at least one photodiode within at least some of the plurality of sections comprises a plurality of photodiodes.

18. The ambient light sensor of claim 16, wherein the at least one photodiode within each of the plurality of sections is a singular photodiode occupying substantially all of an inner area of that section delineated by the isolation regions forming that section.

19. The ambient light sensor of claim 15, wherein the at least one photodiode within each of the plurality of sections responds differently to different wavelengths of light; and wherein the color filter is comprised of the plurality of color channels, with at least some of the plurality of color channels being associated with at least three of the plurality of sections, the at least one photodiodes of the at least three of the plurality of sections having poorer response to at least some wavelengths of light outside of a range of human photopic vision than to wavelengths of light inside of the range of human photopic vision.

20. The ambient light sensor of claim 15, wherein the at least one photodiode within each of the plurality of sections responds differently to different wavelengths of light such that the at least one photodiode within each of the plurality of sections has poorer response to at least some wavelengths of light outside of a range of human photopic vision than to wavelengths of light inside of the range of human photopic vision; and wherein the color channels assigned to the at least some wavelengths of light outside of the range of human photopic vision are associated with the sections within an outer one of the plurality of concentric regions.

21. The ambient light sensor of claim 15, wherein the color filter is comprised of the plurality of color channels, with at least some of the plurality of color channels being associated with at least three of the plurality of sections.

22. The ambient light sensor of claim 15, wherein the color filter is comprised of the plurality of color channels, with at least some of the plurality of color channels being associated with at least three of the plurality of sections but with others of the plurality of color channels being associated with at least two of the plurality of sections.

* * * * *